United States Patent
Davis et al.

(10) Patent No.: US 9,955,608 B2
(45) Date of Patent: Apr. 24, 2018

(54) RACK ANTI-TIP SYSTEM

(71) Applicant: Dell Products L.P., Round Rock, TX (US)

(72) Inventors: James Samuel Davis, Round Rock, TX (US); Steven Embleton, Austin, TX (US); Jay Fred Voigt, Cedar Park, TX (US)

(73) Assignee: Dell Products L.P., Round Rock, TX (US)

( * ) Notice: Subject to any disclaimer, the term of this patent is extended or adjusted under 35 U.S.C. 154(b) by 15 days.

(21) Appl. No.: 15/072,654

(22) Filed: Mar. 17, 2016

(65) Prior Publication Data
US 2017/0273212 A1 Sep. 21, 2017

(51) Int. Cl.
| | | |
|---|---|---|
| A47B 81/00 | (2006.01) | |
| H05K 7/18 | (2006.01) | |
| H05K 7/14 | (2006.01) | |
| A47B 97/00 | (2006.01) | |

(52) U.S. Cl.
CPC .............. *H05K 7/18* (2013.01); *A47B 97/00* (2013.01); *H05K 7/1488* (2013.01); *A47B 2097/008* (2013.01)

(58) Field of Classification Search
CPC ................................ G06F 1/181; H05K 7/183
USPC ............................. 312/223.1, 223.2; 211/26
See application file for complete search history.

(56) References Cited

U.S. PATENT DOCUMENTS

| | | | | |
|---|---|---|---|---|
| 4,372,632 A | * | 2/1983 | Villa ..................... | E05B 65/463 312/107.5 |
| 4,519,656 A | * | 5/1985 | Raz ........................ | A47B 67/005 211/119.009 |
| 8,570,753 B2 | * | 10/2013 | Zhang ................... | H05K 7/1489 211/26 |
| 8,985,345 B2 | * | 3/2015 | Fan ........................ | H05K 7/1488 211/26 |
| 2004/0174105 A1 | * | 9/2004 | Hung ..................... | A47B 91/02 312/351.1 |
| 2009/0251038 A1 | * | 10/2009 | Yu .......................... | A47B 97/00 312/351.1 |
| 2012/0013092 A1 | * | 1/2012 | Fan ........................ | H05K 7/1488 280/79.3 |
| 2012/0193499 A1 | * | 8/2012 | Lin .......................... | F16M 7/00 248/346.05 |

(Continued)

OTHER PUBLICATIONS

"Dell™, Installing the Rack Stabilizer Feet," H686Jcc0.fm, Oct. 2008, 4 Pages.

(Continued)

*Primary Examiner* — Matthew W Ing
(74) *Attorney, Agent, or Firm* — Haynes and Boone, LLP

(57) ABSTRACT

A rack anti-tip system includes an elongated member that includes a first end, a second end located opposite the elongated member from the first end, and a plurality of coupling members that are provided on the elongated member between the first end and the second end and that are each configured to couple the elongated member to a respective adjustable foot subsystem of a rack having a first tip angle. A plurality of anti-tip members extend from the elongated member. The plurality of anti-tip members are positioned relative to the plurality of coupling members to cause the rack to have a second tip angle that is greater than the first tip angle when the elongated member is coupled to the rack.

23 Claims, 14 Drawing Sheets

(56) References Cited

U.S. PATENT DOCUMENTS

2014/0008313 A1* 1/2014 Chen ................ H05K 7/18
211/26

OTHER PUBLICATIONS

"Portable Server Lift—Data Centre Lifting Equipment—Skoots From BIL, Skoots Portable Server Lifts for Data Centres," Model: SKENCSYS1, 2016, 2 Pages, BIL Group Limited, United Kingdom, http://www.bilhandling.co.uk/skoots-portable-server-lifts-for-data-centres-p-265.html.

"Base, Base/Plinths" p. 554, Rittal Catalogue 33/System Accessories.

"BIL Skoots® Moving System SKENCSYS1: Operator's Manual Original Instructions," 1 Page, BIL, United Kingdom, www.bilhandling.co.uk/skoots-skencsys1.

"BIL Skoots®, Fully Loaded Racks Moved Safely & Easily," 1 Page, BIL, United Kingdom.

* cited by examiner

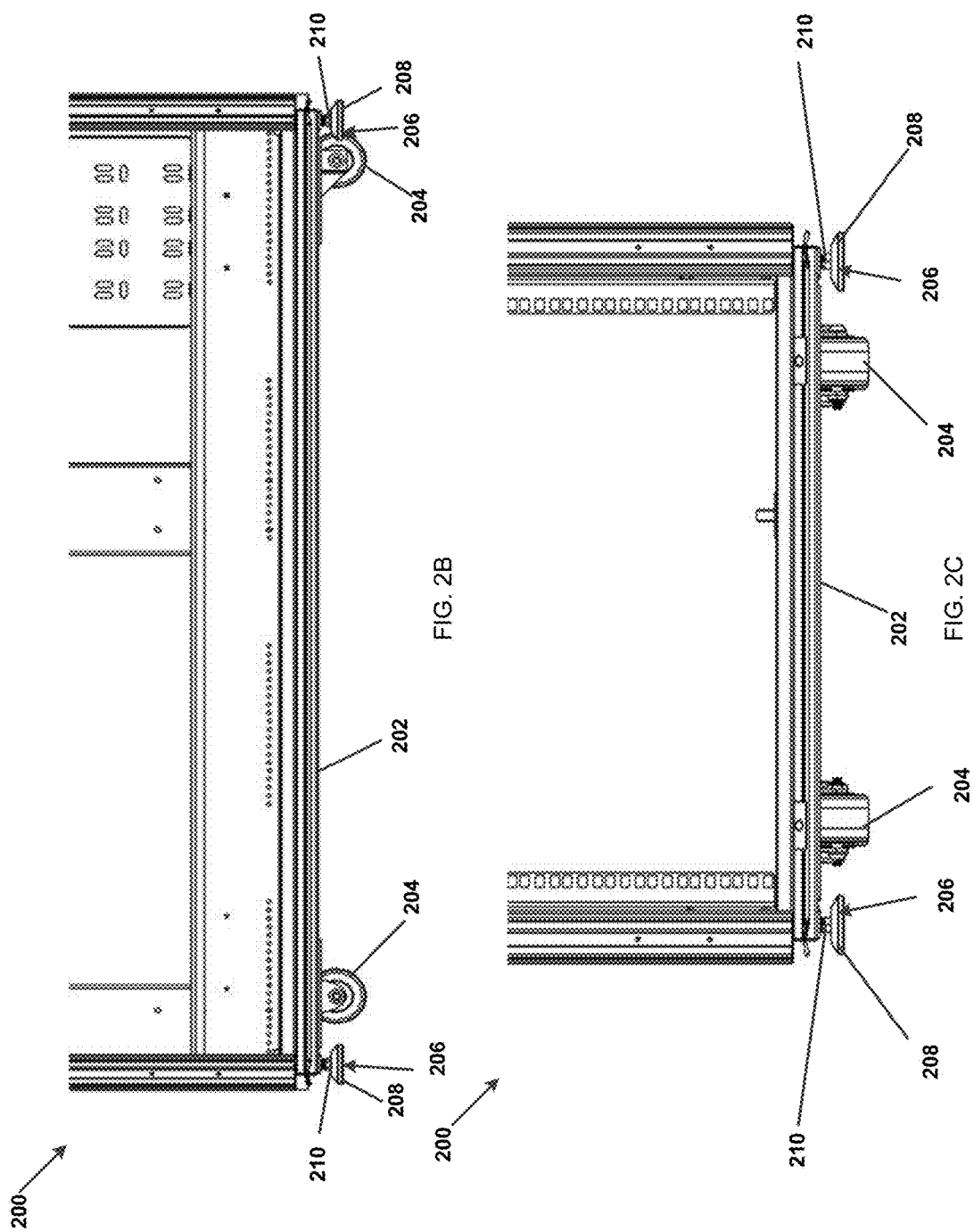

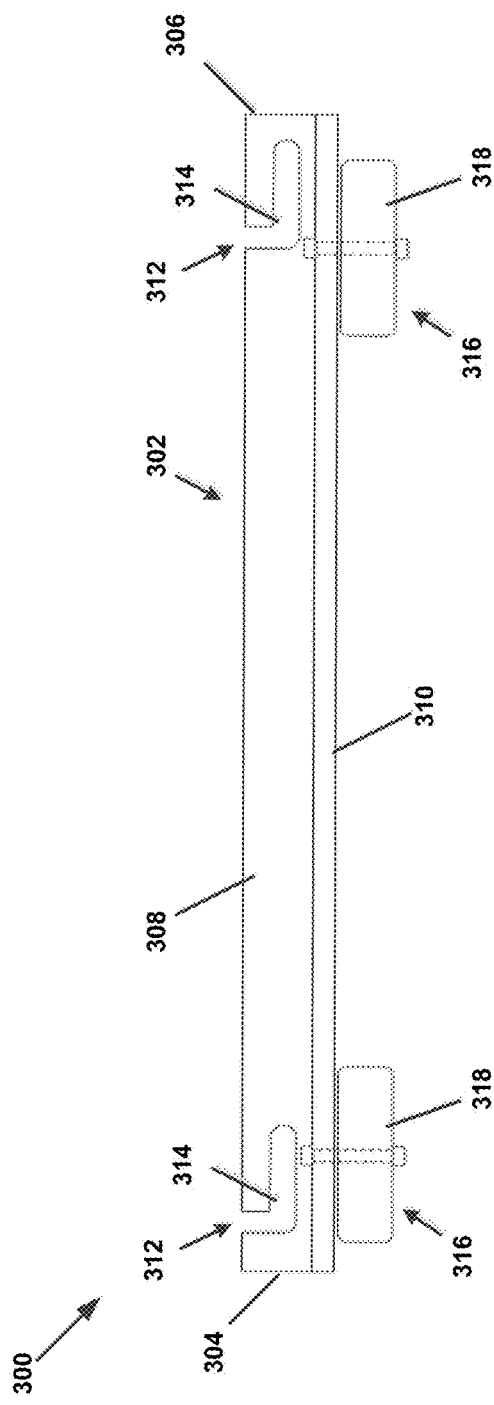
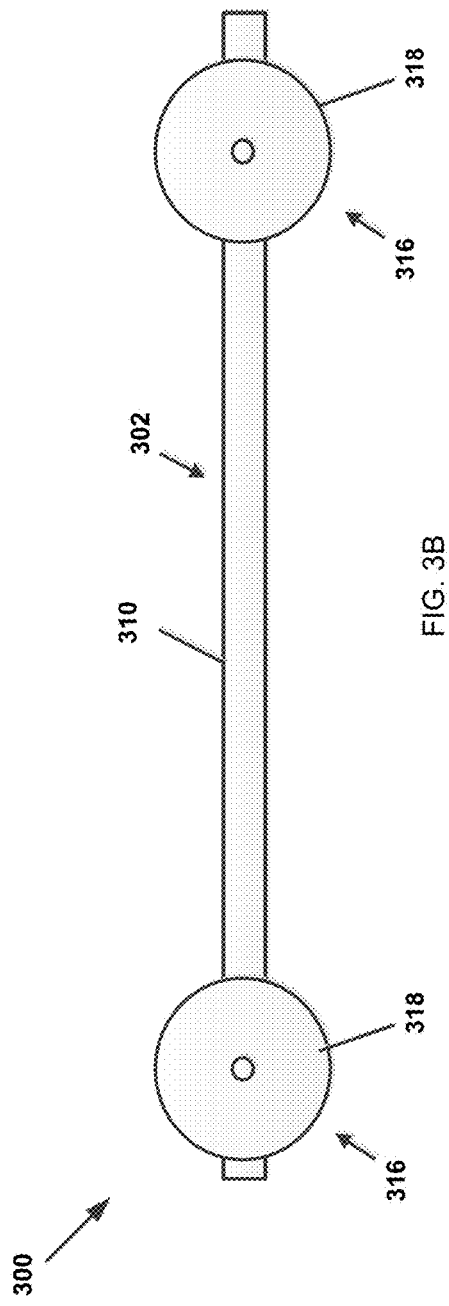
FIG. 3A
FIG. 3B

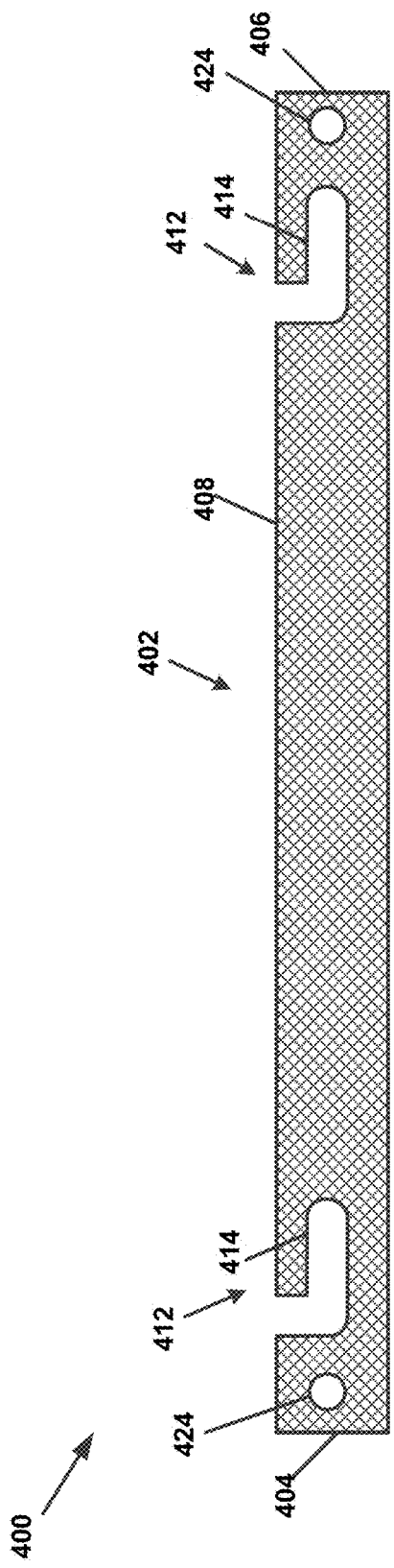
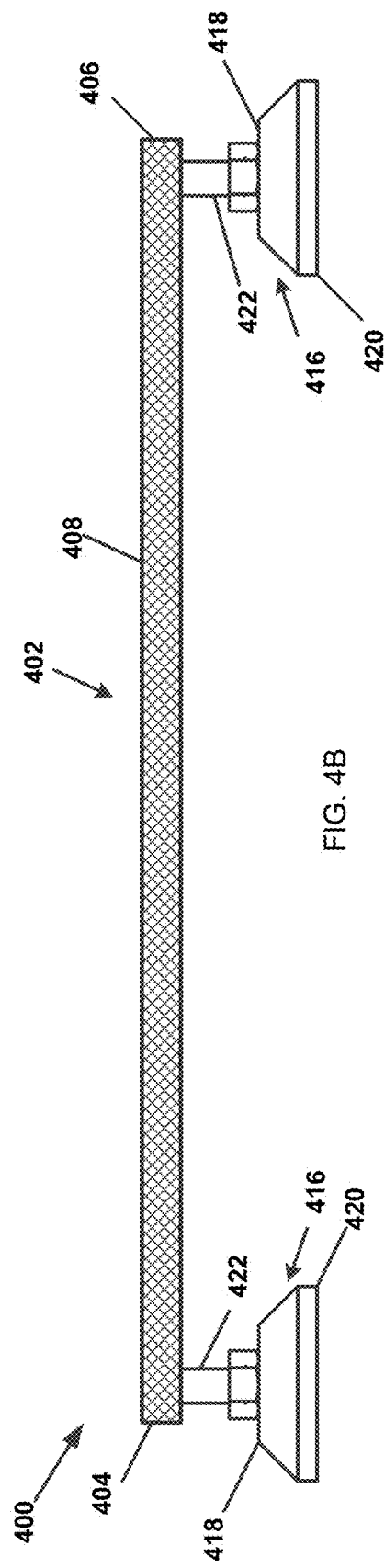

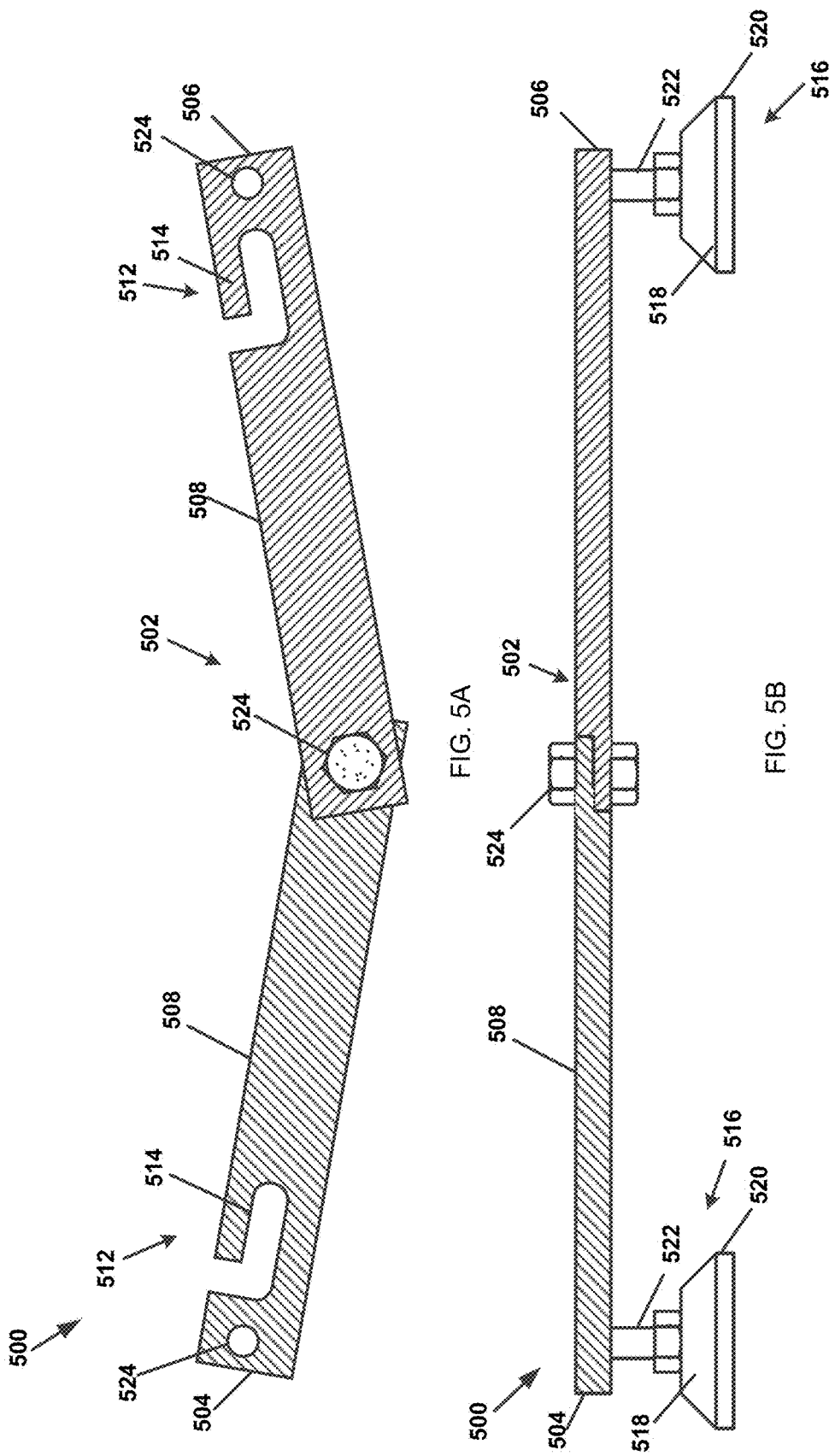

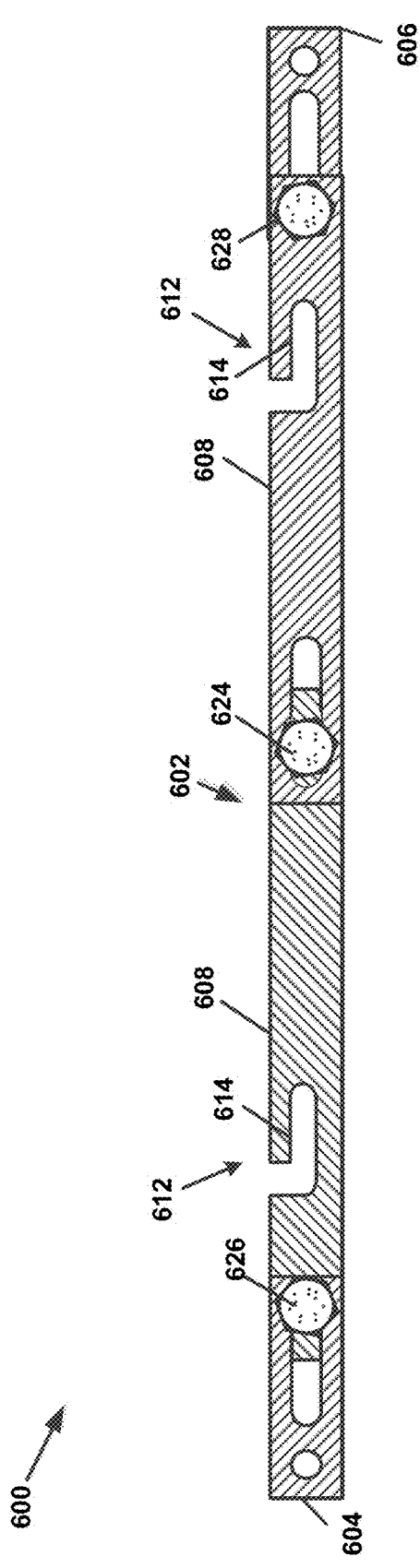
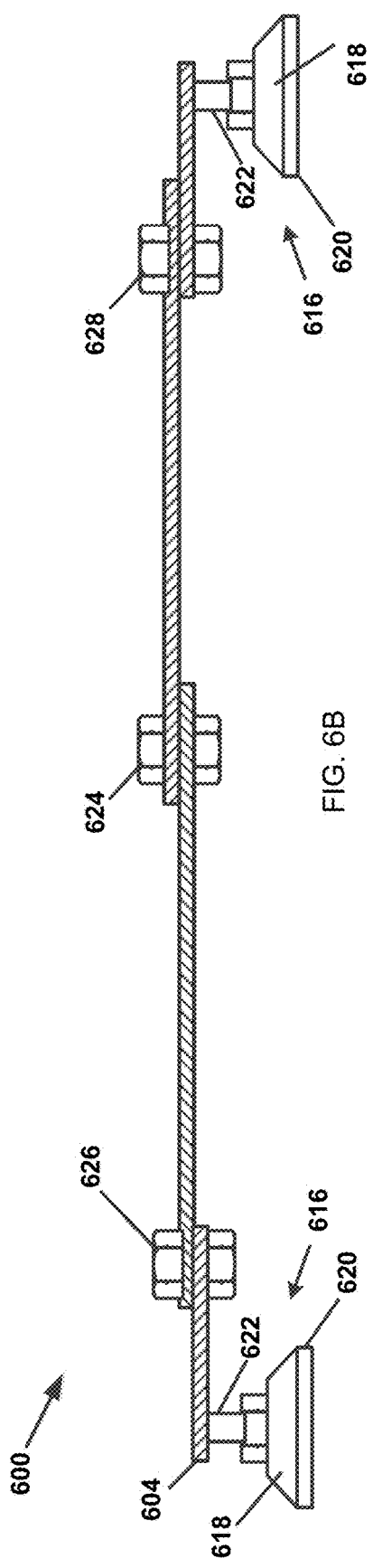
FIG. 6A
FIG. 6B

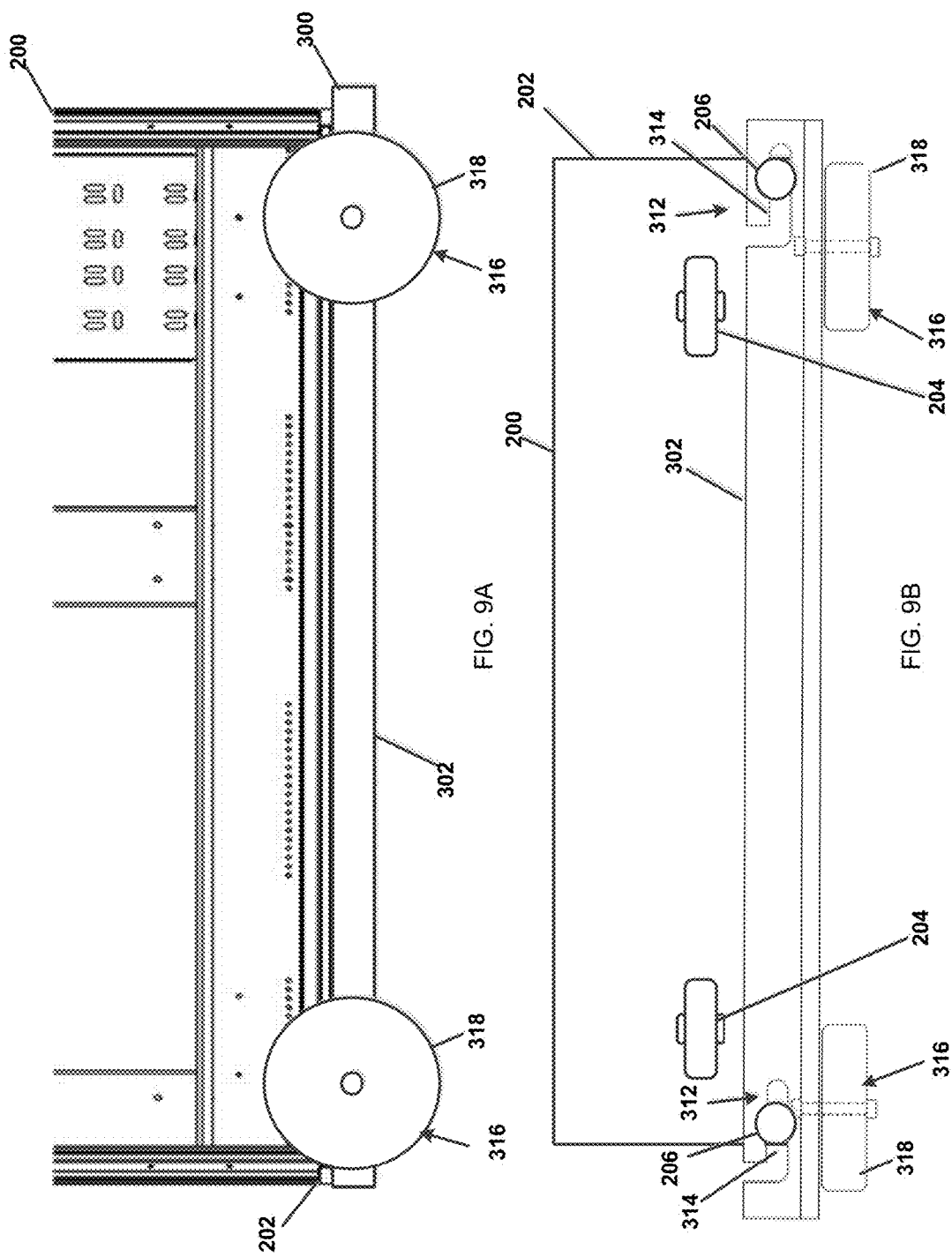

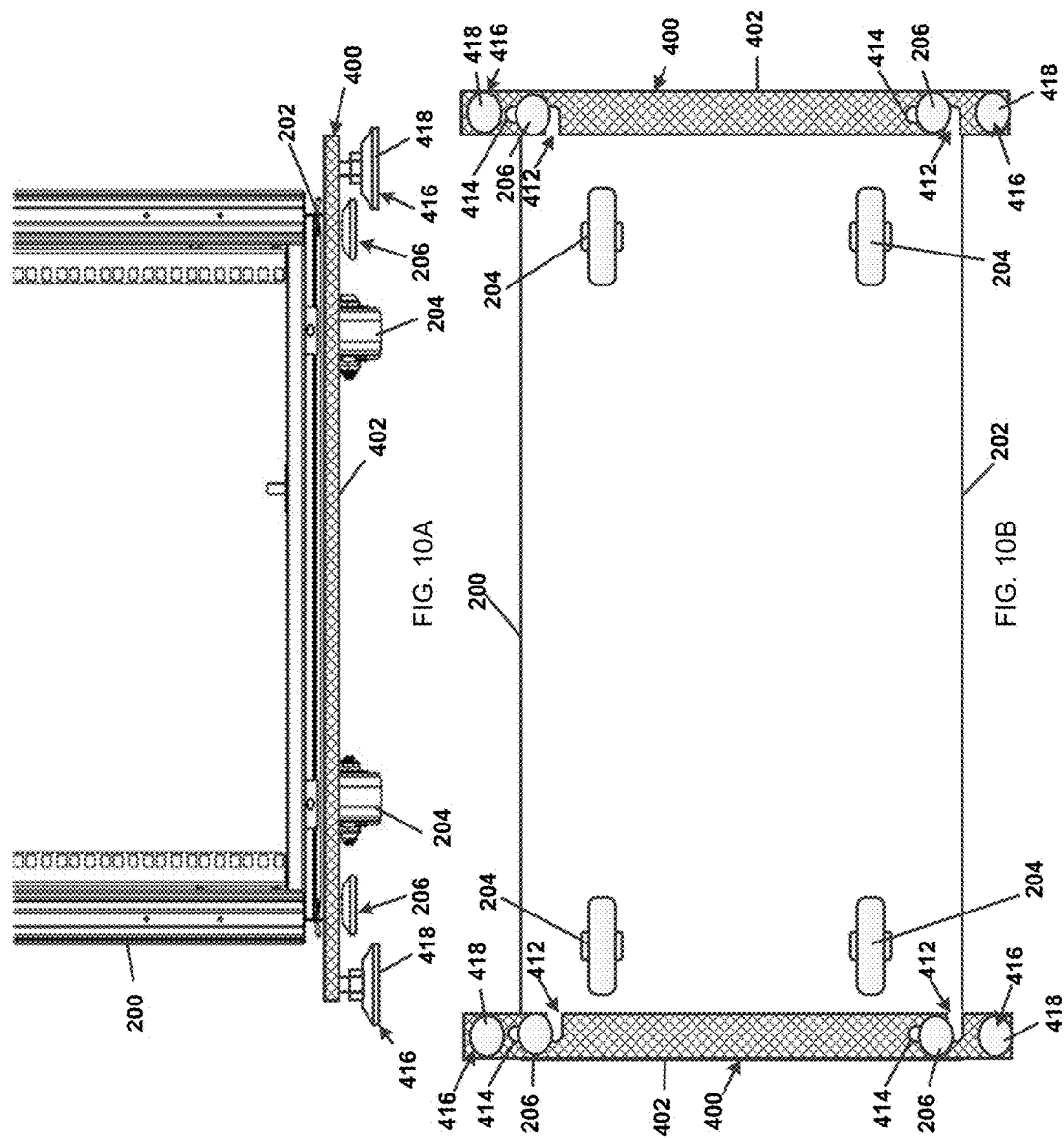

RACK ANTI-TIP SYSTEM

BACKGROUND

The present disclosure relates generally to information handling systems, and more particularly to anti-tip devices used with rack systems.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Some information handling systems such as, for example, servers, networking devices, and storage devices, are typically housed in a rack. Some racks may have relatively tall vertical profiles to increase their capacity to house servers and various other components such as cooling systems, cabling, power systems, networking systems, and other rack components known in the art, while providing a smaller footprint. A fully loaded rack may have considerable weight and, due to its tall vertical profile, may have a high center of gravity that makes the rack prone to tipping. Some safety standards call for rack tip angles to be greater than 10 degrees, and this requirement is sometimes satisfied by securing the rack to a floor, wall, or other rack(s) when the rack is installed at the customer site, and/or utilizing adjustable feet at the corners of the bottom of the rack. However, during delivery and installation, casters at the bottom of the rack are typically utilized to move the rack. Such casters may have a relatively narrow spacing that raises the center of gravity of the rack, which decreases the tip angle when the rack is resting on the casters. Furthermore, the adjustable feet of the rack may have insufficient strength to withstand loading along their radial axis when the rack reaches a certain tip angle. Current anti-tip devices for racks that increase the tip angle are typically designed for specific rack systems (i.e., they are specialized components that the rack must be designed to accommodate) and involve cumbersome tools and effort to install on racks.

Accordingly, it would be desirable to provide an improved server rack anti-tip system.

SUMMARY

According to one embodiment, an Information Handling System (IHS) includes a rack chassis that includes a support base wall and a first tip angle; a plurality of adjustable foot subsystems extending from the support base wall of the rack chassis; a first anti-tip device coupled to a first portion of the plurality of adjustable foot subsystems, wherein the first anti-tip device is oriented parallel to a first edge of the support base wall; and a second anti-tip device couple to a second portion of the plurality of adjustable foot subsystems, wherein the second anti-tip device is oriented parallel to a second edge of the support base wall such that the second anti-tip device is located opposite of rack chassis from the first anti-tip device, wherein each of the first anti-tip device and the second anti-tip device includes: an elongated member that includes: a first end; a second end located opposite the elongated member from the first end; and a plurality of coupling members that are provided on the elongated member between the first end and the second end and that are each configured to couple the elongated member to a respective adjustable foot subsystem of the plurality of adjustable foot subsystems; and a plurality of anti-tip members extending from the elongated member, wherein the plurality of anti-tip members are positioned relative to the plurality of coupling members to cause the rack chassis to have a second tip angle that is greater than the first tip angle when the elongated member is coupled to the rack chassis.

BRIEF DESCRIPTION OF THE DRAWINGS

FIG. 2B is a side schematic view illustrating an embodiment of a bottom portion of the rack of FIG. 2A.

FIG. 2C is a front schematic view illustrating an embodiment of a bottom portion of the rack of FIG. 2A.

FIG. 3A is a top schematic view illustrating an embodiment of an anti-tip device.

FIG. 3B is a side schematic view illustrating an embodiment of the anti-tip device of FIG. 3A.

FIG. 4A is a top schematic view illustrating an embodiment of an anti-tip device.

FIG. 4B is a side schematic view illustrating an embodiment of the anti-tip device of FIG. 4A.

FIG. 5A is a top schematic view illustrating an embodiment of an anti-tip device.

FIG. 5B is a side schematic view illustrating an embodiment of the anti-tip device of FIG. 5A.

FIG. 6A is a top schematic view illustrating an embodiment of an anti-tip device.

FIG. 6B is a side schematic view illustrating an embodiment of the anti-tip device of FIG. 6A.

FIG. 9A is a side schematic view illustrating an embodiment of the rack of FIGS. 2A-2D with the anti-tip device of FIGS. 3A and 3B installed on the rack.

FIG. 9B is a bottom schematic view illustrating an embodiment of the rack and anti-tip devices of FIG. 9A.

FIG. 10A is a front schematic view illustrating an embodiment of the rack of FIGS. 2A-2D with the anti-tip device of FIGS. 4A and 4B installed on the rack.

FIG. 10B is a bottom schematic view illustrating an embodiment of the rack and anti-tip devices of FIG. 10A installed on the rack.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
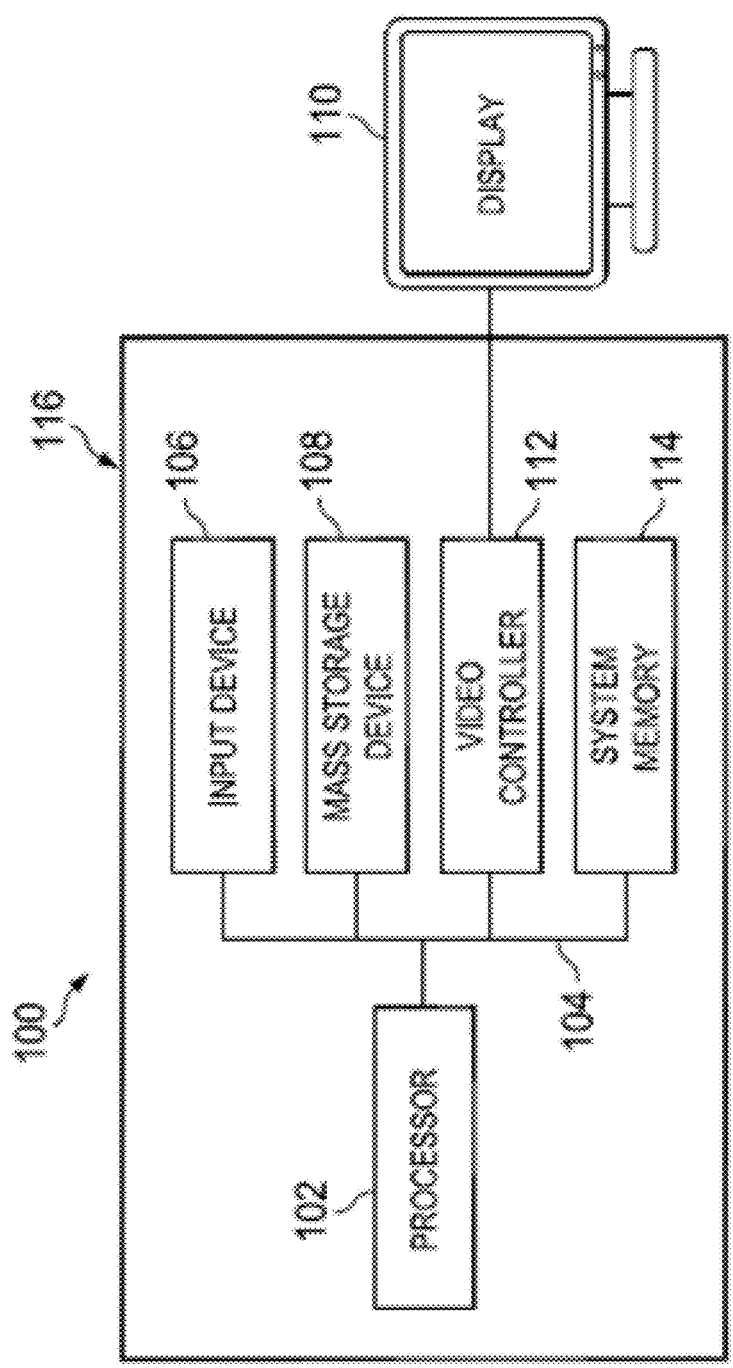
FIG. 1 is a schematic view illustrating an embodiment of an information handling system.
Figure 2A:
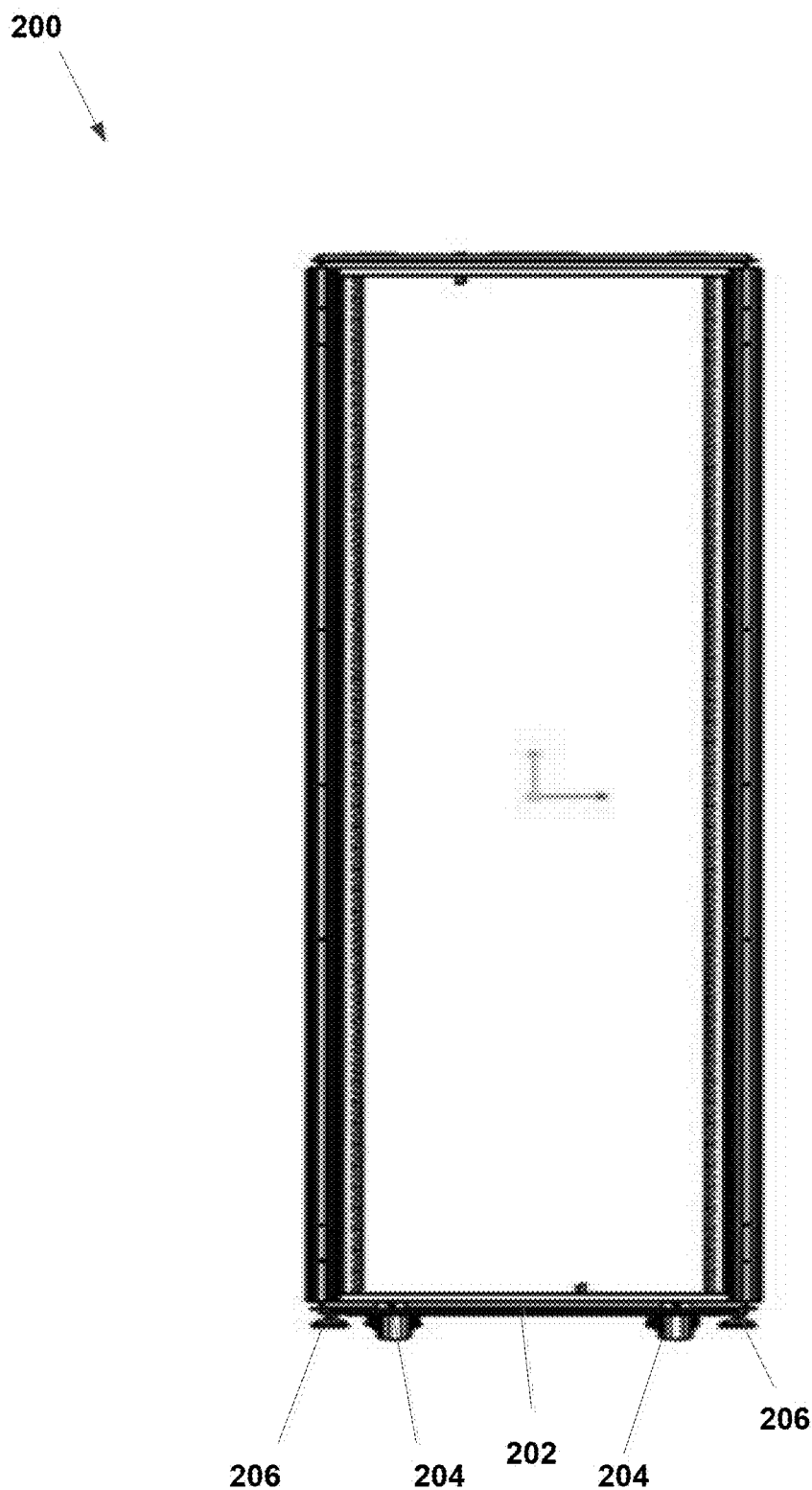
FIG. 2A is a front schematic view illustrating an embodiment of a rack.
Figure 2D:
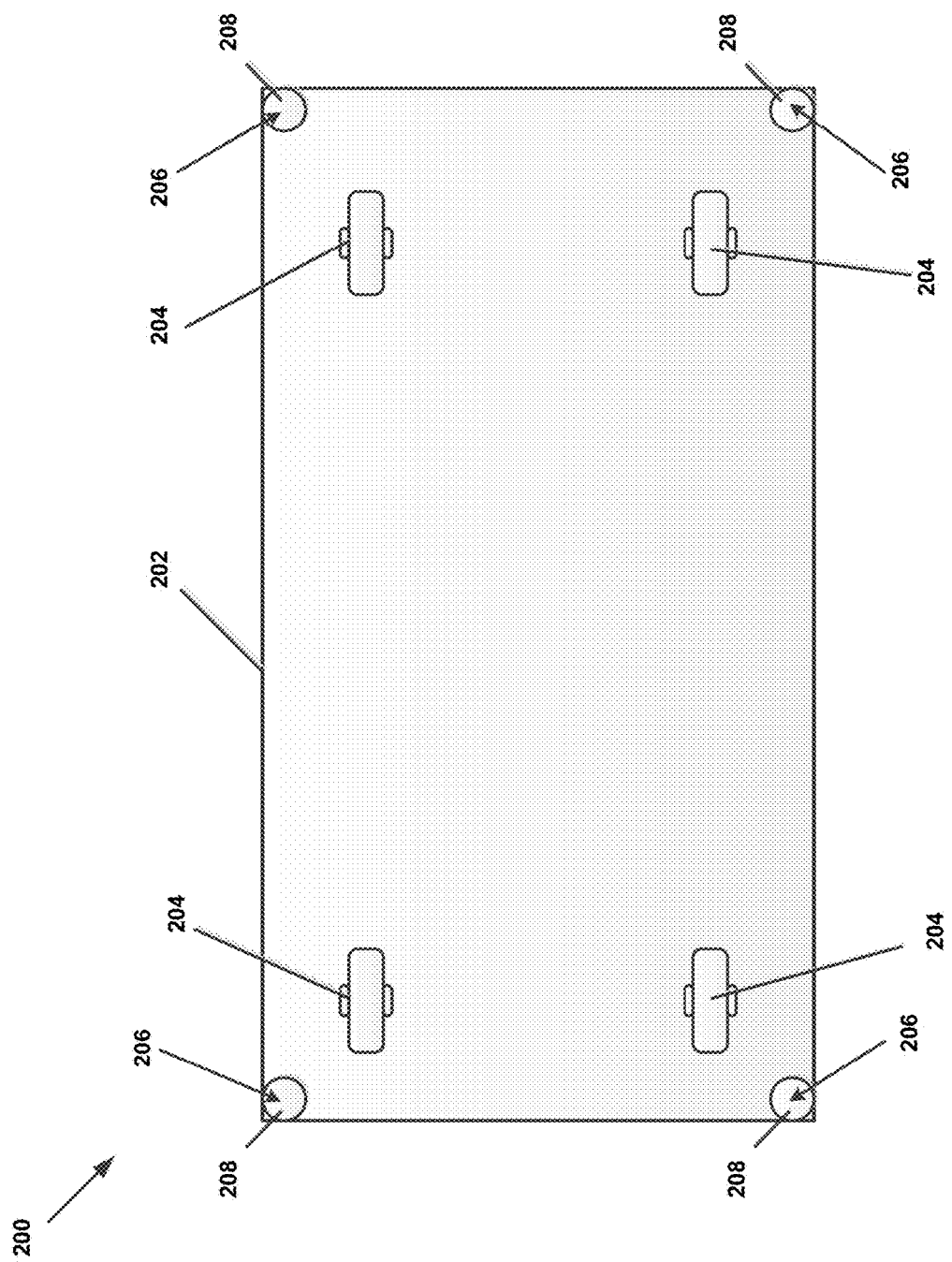
FIG. 2D is a bottom schematic view illustrating an embodiment of the rack of FIG. 2A.

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Referring now to FIGS. 2A, 2B, 2C, and 2D, an embodiment of a rack 200 that may be used with the rack anti-tip system discussed below is illustrated. The rack 200 may house a plurality of the IHSs 100 discussed above with reference to FIG. 1, and thus may include some or all of the components of the IHS 100. One of skilled in the art in possession of the present disclosure will recognize that the rack 200 may house servers, networking devices, and/or storage devices, as well as various other components such as cooling systems, cabling, power systems, networking systems, and other rack components known in the art. The rack 200 includes a support base wall 202 (e.g., a bottom wall of the rack 200) that is illustrated in more detail in FIG. 2D. A plurality of side walls extend from the edges of the support base wall 202 and between the support base wall 202 and a top wall to define a rack housing that is configured to house the servers discussed above. As such, any of the side walls, support base wall 202, and the top wall may include features for defining server housings and coupling/securing servers to the rack 200. The rack 200 also includes a plurality of casters 204 that extend from the support base wall 202. For example, each caster 204 may include at least one wheel that is rotatably coupled to the support base wall 202 and configured to engage a floor and rotate to allow the rack 200 to be moved. In different embodiments, the casters 204 that may be rigid casters, swivel casters, and/or any caster known in the art. While not explicitly illustrated or described herein, one of skill in the art in possession of the present disclosure will recognize that the casters 204 may include a variety of caster components while remaining within the scope of the present disclosure.

The rack 200 also includes a plurality of adjustable foot subsystems 206 that extend from the support base wall 202. For example, each adjustable foot subsystem 206 may extend from the support base wall 202 between a respective castor 204 and a corner of the support base wall 202 as illustrated, although other adjustable foot subsystem/castor orientations may fall within the scope of the present disclosure. Each adjustable foot subsystem 206 may include a foot member 208 and an extender 210 that is configured to adjust the foot member 208 in a vertical direction that allows the foot member 208 to be engaged with and disengaged from a floor that supports the rack 200. For example, the extender 210 may include a threaded rod having a first end and a second end opposite the first end, with the foot member 208 mounted to the first end while the second end of the threaded rod is moveably coupled to the support base wall 202 such that the threaded rod may increase or decrease the distance between the foot member 208 and the support base wall 202. For example, the threaded rod may be received by a threaded bore in the support base wall 202 and the threaded rod may be raised and lowered by rotating the threaded rod. While not explicitly illustrated or described herein, one of skill in the art in possession of the present disclosure will recognize that the extender 210 may include a variety of extender components while remaining within the scope of the present disclosure.

As illustrated in FIGS. 2A-2D, the foot member 208 may be provided in the shape of a flattened cone that is configured to rest upon a generally flat surface such as, for example, a floor. When the rack 200 is being moved, each adjustable foot subsystem 206 may be adjusted relative to the surface such that the foot member 208 is not in contact with the surface and the rack 200 may be moved via the plurality of casters 204. When the rack 200 is at rest, each adjustable foot subsystem 206 may be adjusted relative to the surface such that the foot member 208 is in contact with the surface to prevent the rack 200 from moving on the casters 204, to level the rack 200, and/or provide other adjustable foot subsystem benefits known in the art. While not explicitly illustrated or described herein, one of skill in the art in possession of the present disclosure will recognize that the adjustable foot subsystems 206 may include a variety of adjustable foot subsystem components while remaining within the scope of the present disclosure.

The rack 200 may include one or more tip angles depending on the component(s) (e.g., the casters 204, the adjustable foot subsystems 206) supporting the rack 200. For example, the tip angle may be the angle at which the rack 200 is at equilibrium and any further rotational force (e.g., gravity) applied to the rack 200 will cause the rack 200 to fall over (e.g., such that one of the side walls on the rack 200 engages the floor). The tip angle depends on the center of gravity of the rack 200, and when that center of gravity is shifted, gravitational forces can apply torque to the rack 200 which causes the rack 200 to fall over. The tip angle (also referred to as the critical angle) of the rack 200 is defined by the equation:

$$\theta_c = \tan^{-1}(t/(2*h));$$

where $\theta_c$ is the tip angle, t is the width of a track of the rack 200 (e.g., width between casters 204, width between adjustable foot subsystems 206, and the like), and h is the height of the center of gravity. While a specific rack 200 has been illustrated and described above, one of skill in the art in possession of the present disclosure will recognize that different racks having different features than those specifically illustrated and discussed above with reference to FIGS. 2A-2D may utilize the rack anti-tip systems discussed below while remaining within the scope of the present disclosure.

Referring now to FIG. 3A and FIG. 3B, an embodiment of an anti-tip device 300 that may provide the rack anti-tip system of the present disclosure is illustrated. The anti-tip device 300 may include an elongated member 302 having a first end 304 and a second end 306 that is located opposite the elongated member 302 from the first end 304. The elongated member 302 may be a solid bar or, as illustrated in FIGS. 3A and 3B, one or more planar bars (e.g., a first planar bar 308 and a second planar bar 310) that are fastened to each other at a right angle. In an embodiment, the elongated member 302 includes a plurality of coupling members 312 that are provided on the elongated member 302 between the first end 304 and the second end 306 and that are each configured to couple the elongated member 302 to a respective adjustable foot subsystem 206 of the rack 200 of FIGS. 2A-2D. For example, as illustrated in FIGS. 3A and 3B, each coupling member 312 may be a slot 314 that is defined by the elongated member 302 (e.g., the first planar bar 308) and configured to receive an extender 210 of an adjustable foot subsystem 206. In another example, the slot 314 may be an aperture defined by the first planar bar 308 and through which the extender 210 may be inserted. In yet other examples, the coupling member 312 may be a clamp, a magnet, a strap, a cable tie, and combinations thereof that may couple the anti-tip device 300 to the rack 200. As discussed below, the elongated member 302 may be configured such that the adjustable foot subsystem 206 may be adjusted in such a way that the foot member 208 and support base wall 202 exert opposing forces on the elongated member 302 to effectively mount the elongated member 302 to the rack 200. While not explicitly illustrated or described herein, one of skill in the art in possession of the present disclosure will recognize that the coupling members 312 may include a variety of different coupling member components for coupling the elongated member to the adjustable foot subsystems 206 while remaining within the scope of the present disclosure.

In an embodiment, the anti-tip device 300 includes a plurality of anti-tip members 316 that extend from the elongated member 302. In the illustrated embodiment, the plurality of anti-tip members 316 are positioned relative to the plurality of coupling members 312 such that, when the anti-tip device 300 is coupled to the rack 200, the tip angle of the rack 200 is increased due to the contact of the anti-tip members 316 with the surface (e.g., floor) that is "outside" the casters 204 and/or the adjustable foot subsystems 206, as discussed in further detail below. Specifically, with reference to the tip angle equation above, the anti-tip members 316 are positioned relative to the coupling members 312 to increase the track width t, which in effect decreases the height of the center of gravity h of the rack 200 and increases the tip angle $\theta_c$ of the rack 200 when anti-tip devices 300 are coupled to the rack 200. As illustrated in FIGS. 3A and 3B, the anti-tip members 316 may include wheels 318 that extend transversely to the elongated member 302. For example, the anti-tip members 316 may extend from the second planar bar 310. In another example, the anti-tip members 316 may be a rigid bar that withstands the load of the rack 200 tipping, casters, leveling feet, and bearings. While not explicitly illustrated or described herein, one of skill in the art in possession of the present disclosure will recognize that the anti-tip members 316 may include a variety of anti-tip member components while remaining within the scope of the present disclosure.

Referring now to FIG. 4A and FIG. 4B, an embodiment of an anti-tip device 400 that may provide the rack anti-tip system of the present disclosure is illustrated. The anti-tip device 400 includes an elongated member 402 having a first end 404 and a second end 406 that is located opposite the elongated member 402 from the first end 404. The elongated member 402 may be a planar bar 408 as illustrated in FIGS. 4A and 4B. In an embodiment, the elongated member 402 includes a plurality of coupling members 412 that are provided on the elongated member 402 between the first end 404 and the second end 406 and that are each configured to couple the elongated member 402 to a respective adjustable foot subsystem 206 of the rack 200 of FIGS. 2A-2D. For example, as illustrated in FIGS. 4A and 4B, each coupling member 412 may be a slot 414 that is defined by the elongated member 402 (e.g., the first planar bar 408) and configured to receive an extender 210 of an adjustable foot subsystem 206. In another example, the slot 414 may be an aperture defined by the planar bar 408 and through which the extender 210 may be inserted. As discussed below, the elongated member 402 may be configured such that the adjustable foot subsystem 206 may be adjusted in such a way that the foot member 208 and support base wall 202 exert opposing forces on the elongated member 402 to effectively mount the elongated member 402 to the rack 200.

In an embodiment, the anti-tip device 400 includes a plurality of anti-tip members 416 that extend from the elongated member 402. In the illustrated embodiment, the plurality of anti-tip members 416 are positioned relative to the plurality of coupling members 412 such that, when the anti-tip device 400 is coupled to the rack 200, the tip angle of the rack 200 is increased due to the contact of the anti-tip members 416 with the surface (e.g., floor) that is "outside" the casters 204 and/or the adjustable foot subsystems 206, as discussed in further detail below. Specifically, with reference to the tip angle equation above, the anti-tip members 416 are positioned relative to the coupling members 412 to increase the track width t, which in effect decreases the height of the center of gravity h of the rack 200 and increases the tip angle $\theta_c$ of the rack 200 when anti-tip devices 400 are coupled to the rack 200 As illustrated in FIGS. 4A and 4B the anti-tip members 416 may include adjustable foot subsystems 418 that are similar to the adjustable foot subsystems 206 on the rack 200. For example, each adjustable foot subsystem 418 may include a foot member 420 and an extender 422 that is configured to adjust the foot member 420 in a vertical direction that allows the foot member 420 to be engaged with and disengaged from a floor that supports the rack 200. For example, the extender 422 may include a threaded rod having a first end and a second end opposite the first end, with the foot member 420 mounted to the first end while the second end of the threaded rod is moveably coupled to the elongated member 402 such that the threaded rod may increase or decrease the distance between the foot member 420 and the elongated member 402. For example, the threaded rod may be received by a threaded aperture 424 in the elongated member 402 and the threaded rod may be raised and lowered by rotating the threaded rod. As illustrated in FIGS. 4A and 4B, the anti-tip members 416 may extend from the elongated member 402 immediately adjacent the first end 404 and the second end 406, although other anti-tip member configurations will fall within the scope of the present disclosure. In the specific example illustrated in FIGS. 4A and 4B, a first anti-tip member extends from the elongated member 402 between the first end 404 and a first coupling member while a second anti-tip member extends from the elongated member 402 between the second end 406 and a second coupling member.

As illustrated in FIGS. 4A-4B, the foot member 420 may be provided in the shape of a flattened cone that is configured to rest upon a generally flat surface such as, for example, a floor. When the rack 200 is being moved, each adjustable foot subsystem 418 may be adjusted relative to the surface such that the foot member 420 is not in contact with the surface, allowing the rack 200 may be moved via the plurality of casters 204. However, each adjustable foot subsystem 418 may be adjusted relative to the surface when the rack 200 is being moved such that the foot member 208 will come in contact with the surface when the rack 200 is at an angle in order to increase the tip angle of the rack 200. In other words, the foot members 208 may be configured to allow movement of the rack via the castors 204, while also be configured to engage the surface if the rack 200 starts to tip in order to increase the tip angle 200 of the rack 200 and prevent tipping of the rack 200 during movement of the rack 200. In some embodiments, the adjustable foot subsystems 418 may be configured to withstand greater loading along their radial axis (e.g., an axis that extends through the extenders 422) relative to the adjustable foot subsystems 206 in order to allow the adjustable foot subsystems 418 to withstand the increased force associated with a tilted rack 200. While not explicitly illustrated or described herein, one of skill in the art in possession of the present disclosure will recognize that the anti-tip members 416 may include a variety of anti-tip member components while remaining within the scope of the present disclosure.

Referring now to FIG. 5A and FIG. 5B, an embodiment of an anti-tip device 500 that may provide the rack anti-tip system of the present disclosure is illustrated. The anti-tip device 500 may include an elongated member 502 having a first end 504 and a second end 506 that is located opposite the elongated member 502 from the first end 504. The elongated member 502 may include a plurality of planar bars 508 as illustrated in FIGS. 5A and 5B. However, it is contemplated that the elongated member may include fastened together planar bars similar to the first planar bar 308 and the second planar bar 310 discussed above with reference to FIGS. 3A and 3B. In an embodiment, the elongated member 502 includes a plurality of coupling members 512 that are provided on the elongated member 502 between the first end 504 and the second 506 end and that are each configured to couple the elongated member 502 to a respective adjustable foot subsystem 206 of the rack 200 of FIGS. 2A-2D. For example, as illustrated in FIGS. 5A and 5B, each coupling member 512 may be a slot 514 that is defined by the elongated member 502 (e.g., each of the planar bars 508) and configured to receive an extender 210 of an adjustable foot subsystem 206. In another example, the slot 514 may be an aperture defined by the planar bars 508 and through which the extender 210 may be inserted. As discussed below, the elongated member 502 may be configured such that the adjustable foot subsystem 206 may be adjusted in such a way that the foot member 208 and support base wall 202 exert opposing forces on the elongated member 502 to effectively mount the elongated member 502 to the rack 200. In an embodiment, the anti-tip device 500 includes a plurality of anti-tip members 516 that may include adjustable foot subsystems 518 that are similar to the adjustable foot subsystems 206 on the rack. For example, each adjustable foot subsystems 518 may include a foot member 520 and an extender 522 that is configured to adjust the foot member 520 in a vertical direction that allows the foot member 520 to be engaged with and disengaged from a floor that supports the rack 200.

In the illustrated embodiment, the elongated member 502 includes an adjuster 524 that is located between the first end 504 and the second end 506 of the elongated member 502 and that provides the moveable coupling between the planar bars 508. For example, the adjuster 524 may be configured to adjust the distance between a first coupling member and a second coupling member of the plurality of coupling members 512 that are provided on the elongated member 502. As illustrated in FIGS. 5A and 5B, the adjuster 524 pivotally connects two or more portions (e.g., the planar bars 508) of the elongated member 502 so that the distance between the first coupling member 512 defined by a first of the planar bars 508 and the second coupling member 512 defined by a second of the planar bars 508 decreases when the angle of the adjustor 524 decreases from 180 degrees, and the distance between the first coupling member 512 and the second coupling member 512 increases when the angle of the adjustor 524 increases toward 180 degrees. For example, the adjuster 524 may include a pin, a hinge, bolt, and/or other pivotable or moveable components known in the art that may movably couple two or more portions of the elongated member 502. As discussed below, adjustment of the distance between the first coupling member and the second coupling member on the elongated member 502 may allow the anti-tip device 500 to be mounted to various racks 200 having varying distances between their adjustable foot subsystems 206. While not explicitly illustrated or described herein, one of skill in the art in possession of the present disclosure will recognize that the adjuster 524 may include a variety of adjuster components between two portions of an elongated member 502 while remaining within the scope of the present disclosure.

Referring now to FIG. 6A and FIG. 6B, an embodiment of an anti-tip device 600 that may provide the rack anti-tip system of the present disclosure is illustrated. The anti-tip device 600 may include an elongated member 602 having a first end 604 and a second end 606 that is located opposite the elongated member 602 from the first end 604. The elongated member 602 may include a plurality of planar bars 608 as illustrated in FIGS. 6A and 6B. However, it is contemplated that the elongated member may include fastened together planar bars similar to the first planar bar 308 and the second planar bar 310 discussed above with reference to FIGS. 3A and 3B. In an embodiment, the elongated member 602 includes a plurality of coupling members 612 that are provided on the elongated member 602 between the first end 604 and the second end 606 and that are each configured to couple the elongated member 602 to a respective adjustable foot subsystem 206 of the rack 200 of FIGS. 2A-2D. For example, as illustrated in FIGS. 6A and 6B, each coupling member 612 may be a slot 614 that is defined by the elongated member 602 (e.g., one of the planar bars 608) and configured to receive an extender 210 of an adjustable foot subsystem 206. In another example, the slot 514 may be an aperture defined by the planar bar 508 and through which the extender 210 may be inserted. As discussed below, the elongated member 502 may be configured such that the adjustable foot subsystem 206 may be adjusted in such a way that the foot member 208 and support base wall 202 exert opposing forces on the elongated member 502 to effectively mount the elongated member 502 to the rack 200. In an embodiment, the anti-tip device 600 may include a plurality of anti-tip members 616 that include adjustable foot subsystems 618 that are similar to the adjustable foot subsystems 206 on the rack. As such, the adjustable foot subsystem 618 may include a foot member 620 and an extender 622 that is configured to adjust the foot member 620 in a vertical direction that allows the foot member 620 to be engaged with and disengaged from a floor that supports the rack 200.

In the illustrated embodiment, the elongated member 602 includes a first adjuster 624 that is located between the first end 604 and the second end 606 of the elongated member 602 and that provides a moveable coupling between two of the planar bars 608. For example, the first adjuster 624 may be configured to adjust the distance between a first coupling member and a second coupling member of the plurality of coupling members 612 that are provided on the elongated member 602. As illustrated in FIGS. 6A and 6B, the adjuster 624 pivotally connects and/or extends two or more portions of the elongated member 602 (e.g., two of the planar bars 608) to increase or decrease the distance between the first coupling member and the second coupling member. Adjustment of the distance between the first coupling member and the second coupling member may allow the anti-tip device 600 to be mounted to various racks 200 having varying distances between their adjustable foot subsystems 206 in substantially the same manner as discussed above for the anti-tip device 500 of FIGS. 5A and 5B.

In an embodiment, the elongated member 602 includes at least one of a second adjuster 626 and a third adjuster 628. For example, the second adjuster 626 be located between a first coupling member of the plurality of coupling members 612 and a first anti-tip member the plurality of anti-tip members 616, and the third adjuster 628 may be located between a second coupling member 612 of the plurality of coupling members and a second anti-tip member 616 of the plurality of anti-tip members. As discussed below, the second adjusters 626 and the third adjusters 628 are configured to provide for the adjustment of the position of the foot members 620 (e.g., such that they may extend from the corners of the base support member 202 on the rack 200). As illustrated in FIGS. 6A and 6B, the first adjuster 624, the second adjuster 626, and/or the third adjuster 628 may include a slot defined by a respective portion (e.g., planar bar 608) of the elongated member 602, and an aperture defined through another portion (e.g., planar bar 608) of the elongated member 602. The two portions of the elongated member 602 (e.g., moveably coupled planar bars 608) may overlap, and the adjusters 624, 626, and 628 include a fastener that is inserted through the aperture and slot defined by those two portions so that the two portions of the elongated member 602 may pivot and/or extend with respect to each other. While the adjusters 624, 626, and 628 illustrate specific examples of adjusters, one skilled in the art will recognize that the anti-tip device 600 may include any number of adjusters and/or types of adjusters that adjust the distance between coupling members 612, and/or the distance between coupling members 612 and anti-tip members 616, while remaining within the scope of the present disclosure. For example, the anti-tip members 316 of FIGS. 3A and 3B may include an adjuster to transversely extend the anti-tip members 316 away from the coupling members 312.

Figure 7A:
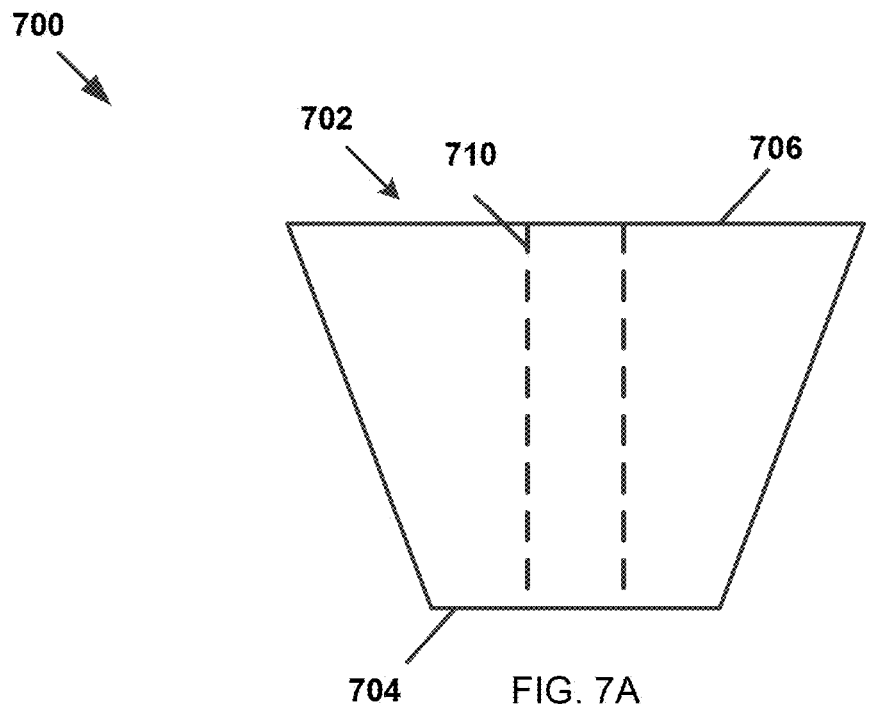
FIG. 7A is a side schematic view illustrating an embodiment of an anti-tip device.
Figure 7B:
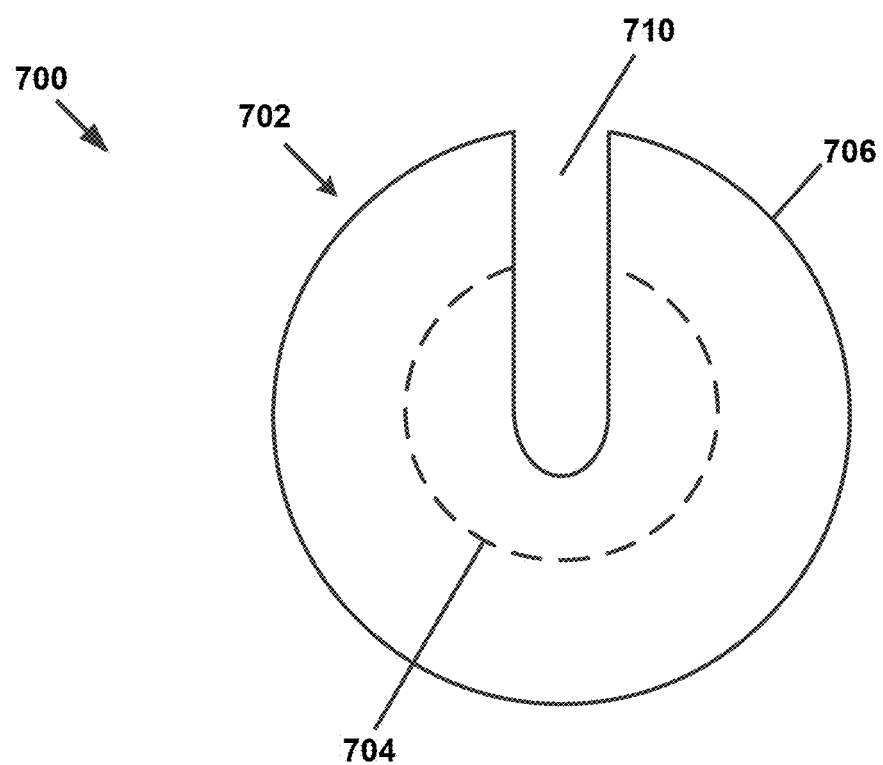
FIG. 7B is a top schematic view illustrating an embodiment of the anti-tip device of FIG. 7A.

Referring now to FIG. 7A and FIG. 7B, an embodiment of an anti-tip device 700 that may provide the rack anti-tip system of the present disclosure is illustrated. The anti-tip device 700 may include an adjustable foot subsystem support 702 that is configured to provide support along a radial axis of an adjustable foot subsystem 206 of FIGS. 2A-2D. In the illustrated embodiment, the adjustable foot subsystem support 702 includes a first surface 704 and a second surface 706 that is located opposite the adjustable foot subsystem support 702 from the first surface 704. The first surface 704 is configured to engage a foot member such as foot member 208 of the adjustable foot subsystem 206, while the second surface 706 is configured to engage the support base wall 202 while the first surface 704 is engaging the foot member 208. The adjustable foot subsystem support 702 may include a material such as an acrylic, a metal, rubber, and/or any other material known in the art that may include material properties that would provide the functionality discussed below. As illustrated in FIGS. 7A and 7B, the adjustable foot subsystem support 702 may be provided by an inverted frustum with a circular base, but one skilled in the art in possession of the present disclosure will recognize that the adjustable foot subsystem support 702 may include a variety of shapes such as frustums with different geometric bases, cylinders, cubes, rectangular prisms, and other three-dimensional shapes known in the art.

In an embodiment, the adjustable foot subsystem support 702 also includes a coupling member 710 that is configured to receive the extender 210 of the adjustable foot subsystem 206. As illustrated in FIGS. 7A and 7B, the coupling member 710 may be provided by an opening that is defined by the adjustable foot subsystem support 702 and that is configured to receive the extender 210. In another example, the coupling member 710 may be an aperture through the adjustable foot subsystem support 702, which the extender 210 may be inserted. In yet other examples, the coupling member 710 may be a clamp, a magnet, a strap, a cable tie, and combinations thereof. While a specific example of a coupling member on the adjustable foot support 702 is illustrated, one skilled in the art will recognize that the adjustable foot subsystem support 702 may include a variety of coupling members known in the art that would be configured to couple the adjustable foot subsystem support 702 to an adjustable foot subsystem.

Figure 8:
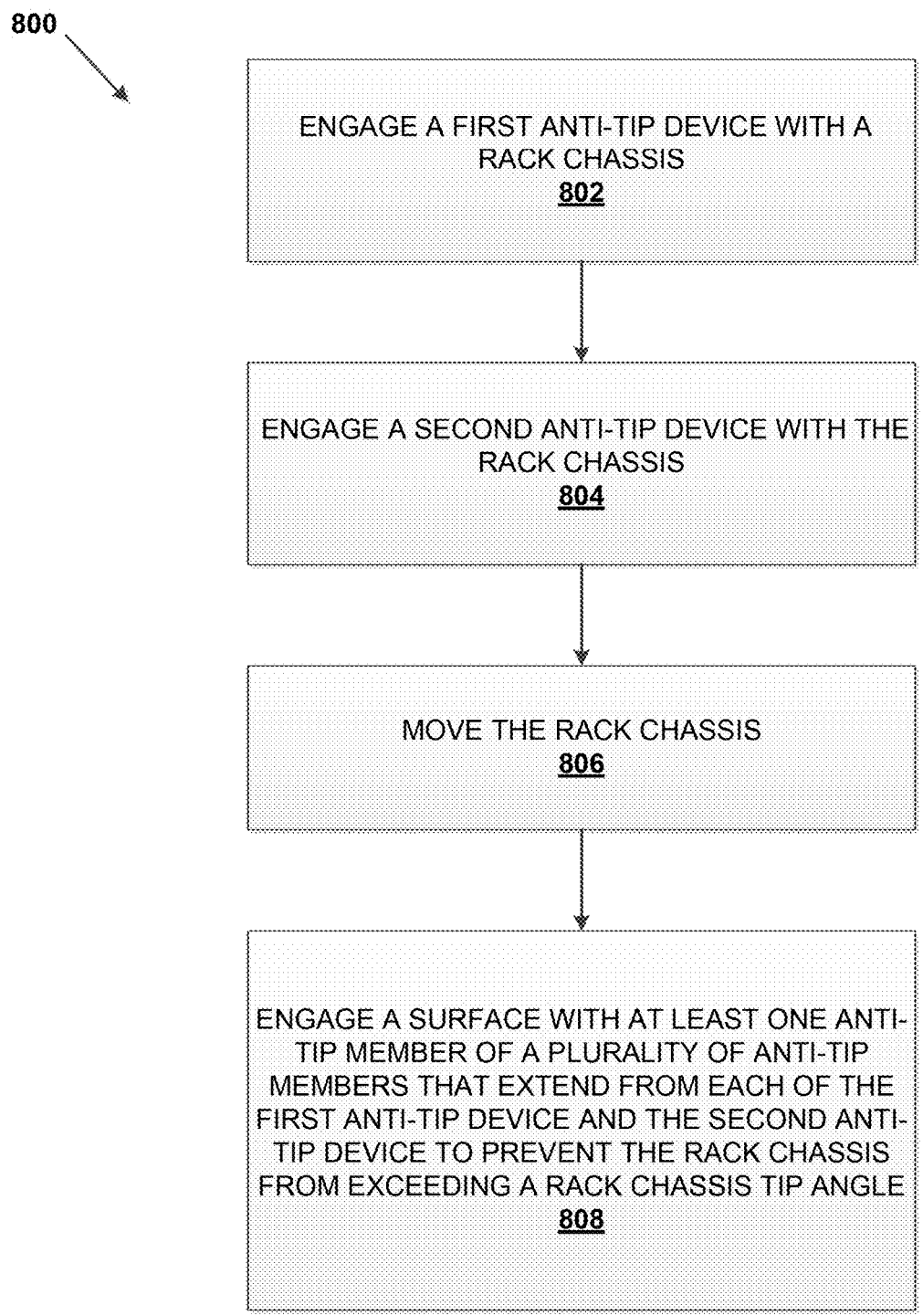
FIG. 8 is a flow chart illustrating a method of moving a rack with a rack anti-tip system.

Referring now to FIG. 8, an embodiment of a method 800 of preventing a rack from tipping with a rack anti-tip system is illustrated. As discussed below, the anti-tip device of the present disclosure may be provided on a rack to increase a tip angle of the rack and prevent the rack from tipping during movement of the rack. An elongated member of the anti-tip device provides structural support for a plurality of anti-tip members that extend the track width of the rack, thus lowering the height of the center of gravity of the rack and increasing the tip angle of the rack. Increasing the tip angle of the rack is particularly useful while the rack is being moved via castors on the rack because those casters typically have a narrow track width that results in a relatively low tip angle that does not meet recommended tip angle requirements during rack movement. Furthermore, the anti-tip device is configured to mount to features that are common to most rack systems such as, for example, adjustable foot subsystems that are conventionally used to stabilize the rack when the rack has been moved to the location at which it will be used. One of skill in the art in possession of the present disclosure will recognize that the method 800 may be performed by any of the anti-tip devices illustrated and/or described above that utilize the elongated members and the anti-tip members, as well as combinations of the elongated members and the anti-tip members, that are described above.

The method begins at block 802 where a first anti-tip device is engaged with a rack chassis, and block 804 where a second anti-tip device is engaged with the rack chassis. In an embodiment, a plurality of coupling members of the first anti-tip device are engaged to a first set of adjustable foot subsystems of the rack chassis along a first side of the rack chassis, and a plurality of coupling members of the second anti-tip device are engaged with a second set of adjustable foot subsystems of the rack chassis along a second side of the rack chassis that is opposite the rack chassis from the first side. As discussed above, the plurality of coupling members of the first anti-tip device and the second anti-tip device are provided between a first end and a second end of an elongated member of the first anti-tip device, and a first end and a second end of an elongated member of the second anti-tip device, and may be engaged with the rack by each coupling member receiving a respective adjustable foot subsystem. Each respective adjustable foot subsystem may be adjusted to mount the elongated member of the first anti-tip device and the elongated member of the second anti-tip device to the rack chassis.

In an embodiment, the anti-tip devices 300 of FIGS. 3A and 3B may be engaged on opposing sides of the rack 200. FIG. 9A and FIG. 9B illustrate the anti-tip device 300 engaged with the rack 200 on a first side, and one of skill in the art will recognize how another anti-tip device 300 may be engaged with the rack 200 on a second side that is opposite the rack from the first side. As illustrated in FIGS. 9A and 9B, the coupling members 312 of the anti-tip device 300 are each engaged with respective adjustable foot subsystem 206 of the rack 200 along the side of the rack 200. For example, the anti-tip devices 300 may be engaged with the rack along the sides of the rack 200 that are parallel with the direction of the casters 204 of the rack 200 such as, for example, the side of the rack that extends between the front wall and the back wall of the rack 200. The coupling members 312 may include the slots 314 which are configured to receive the extenders 210 of the adjustable foot subsystem 206 as discussed above. As discussed above, the extenders 210 may include threaded rods that may be rotated into and out of a threaded bore in the support base wall 202 of the rack 200 so that the foot member 208 and support base wall 202 exert opposing forces on the elongated member 302 to mount the elongated member 302 to the rack 200.

In an embodiment, the anti-tip devices 400 of FIGS. 4A and 4B may be engaged on opposing sides of the rack 200.

Figure 10C:
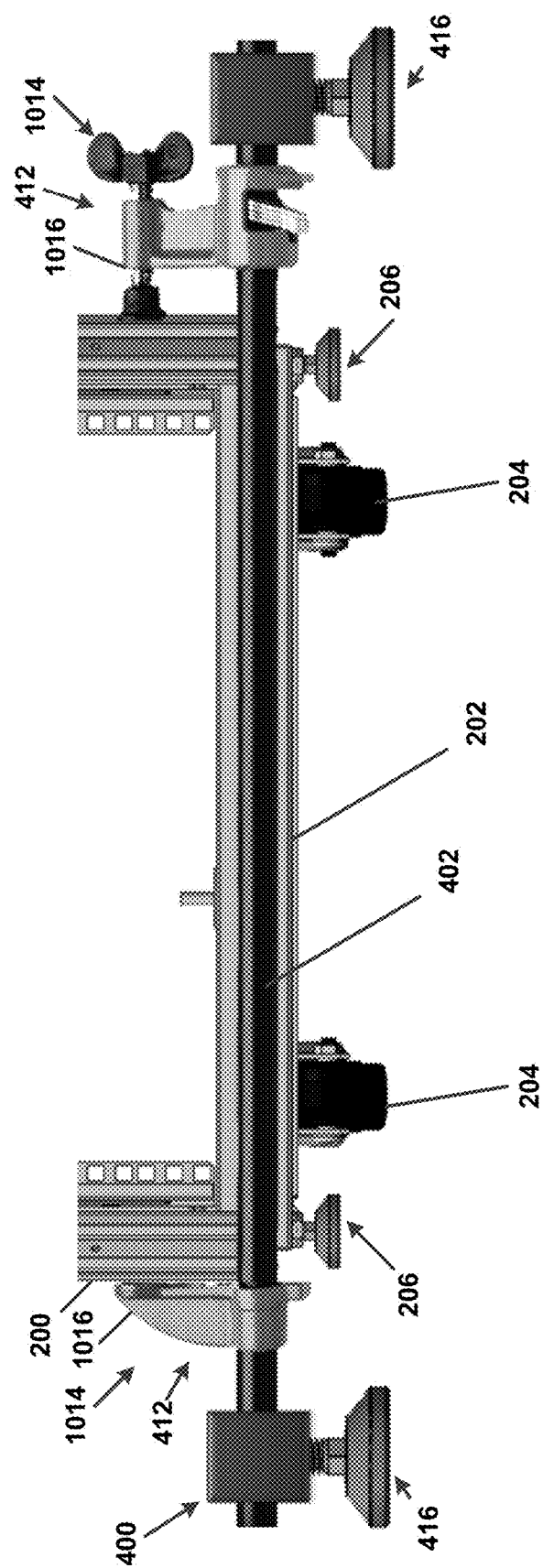
FIG. 10C is a front schematic view illustrating an embodiment of the rack and the anti-tip device of FIG. 10A installed on the rack with a coupling member that includes a clamp assembly.

FIG. 10A, FIG. 10B, and FIG. 100 illustrate the anti-tip device 400 engaged with the rack 200 on opposing sides. As illustrated in FIGS. 10A and 10B, the coupling member 412 of each anti-tip device 400 are each engaged with respective adjustable foot subsystems 206 on respective sides of the rack 200. For example, the anti-tip device 400 may be engaged with the rack 200 along the sides of the rack that are perpendicular with the direction of the casters 204 of the rack 200, such as along a front side and a back side of the rack 200 that correspond to a front wall and a back wall, respectively, of the rack 200. The coupling members 412 may include the slots 414 that are configured to receive the extenders 210 of the adjustable foot subsystem 206, as discussed above. As discussed above, the extenders 210 may include threaded rods that may be rotated into and out of a threaded bore in the support base wall 202 of the rack 200 so that the foot member 208 and support base wall 202 exert opposing forces on the elongated member 402 to mount the elongated member 402 to the rack 200.

In an embodiment, FIG. 100 illustrates the coupling member 412 of each anti-tip device 400 engaging respective rack walls on respective sides of the rack 200. The coupling member 412 includes a clamp assembly 1014 that is configured to engage each surface of opposite rack walls. The clamp assembly 1014 may include at least one adjustable clamp 1016 that may be rotated into and out of the clamp assemblies so that the clamps 1016 and the side walls of the rack 200 exert opposing forces to mount the elongated member 402 to the rack 200.

Figure 11:
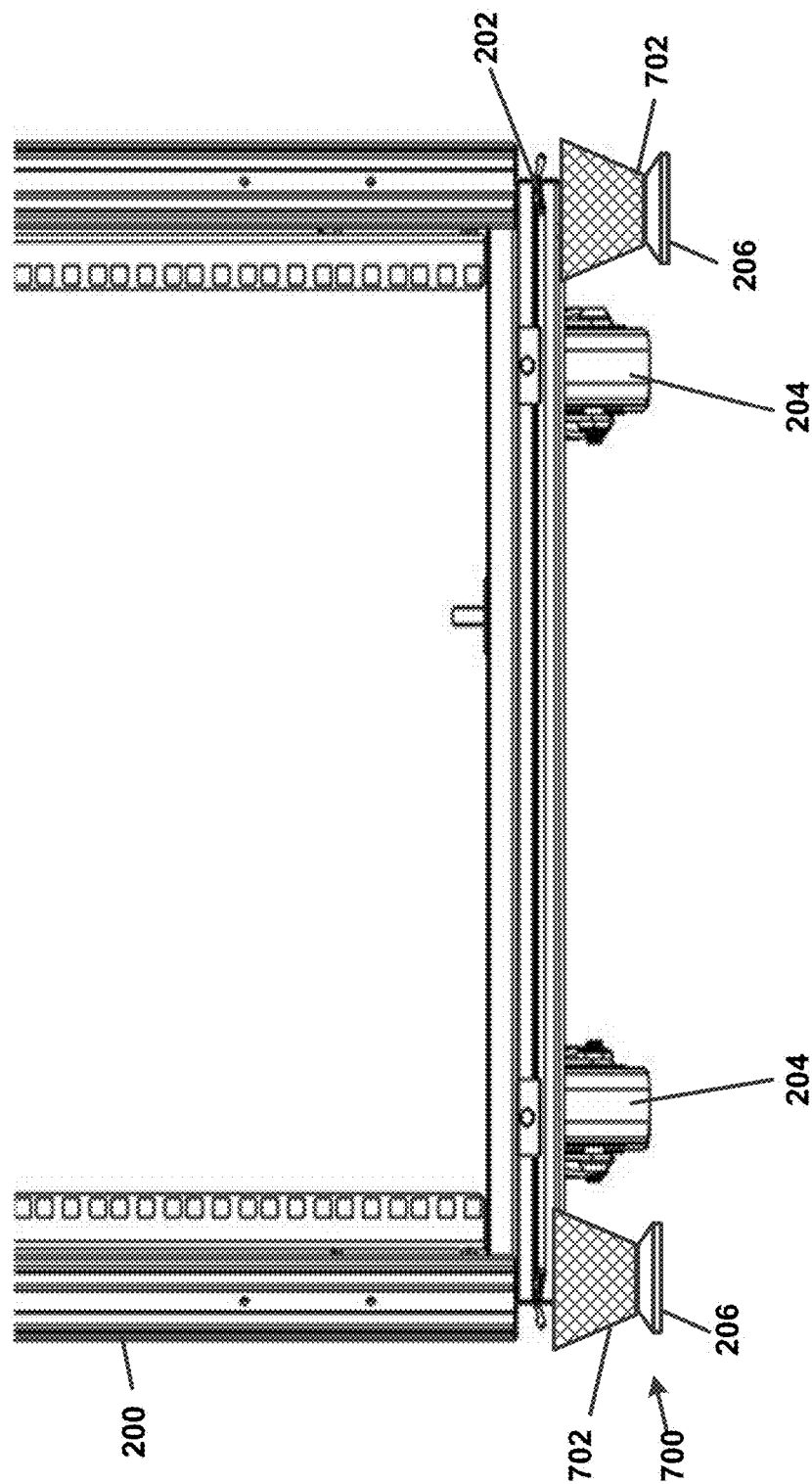
FIG. 11 is a front schematic view illustrating an embodiment of the rack of FIGS. 2A-2D with the anti-tip device of FIG. 7A installed on the rack

In an embodiment, the anti-tip devices 700 of FIGS. 7A and 7B may be engaged with the rack 200. FIG. 11 illustrates the anti-tip devices 700, which each include the adjustable foot subsystem support 702, engaged with respective adjustable foot subsystems 206 on the rack 200. As illustrated in FIG. 11, the coupling members 710 of the anti-tip device 700 are each utilized to engage the adjustable foot subsystem support 702 with a respective adjustable foot subsystem 206 of the rack 200 by utilizing the openings provided with each coupling member 710 to receive the extender 210 of the respective adjustable foot subsystem 206. As discussed above, the extenders 210 may include threaded rods that may be rotated into and out of a threaded bore in the support base wall 202 of the rack 200 so the foot member 208 and support base wall 202 exert opposing forces on the first surface 704 and the second surface 706 of the adjustable foot subsystem support 702, respectively, to mount the adjustable foot subsystem supports 702 to the rack 200.

In an embodiment, blocks 802 and 804 of the method 800 may include adjusting the distance of the coupling members on an elongated member of an anti-tip device by adjusting an adjuster provided on the elongated member. As discussed above, the distance between any two coupling members on an elongated member may be increased or decreased using an adjuster to conform the distance between the coupling members to the distance between adjustable foot subsystems of a rack. The distance between two adjustable foot subsystems may vary depending on the side of the rack the anti-tip device is being mounted, depending on the type of rack being used, (e.g., the distance between two adjustable foot subsystems may vary from rack to rack due to different manufacturers or different rack sizes), and/or depending on other factors known in the art. As illustrated in FIGS. 5A and 5B, the adjuster 524 pivotally connects two or more portions of the elongated member 502 so that the distance between a first coupling member and a second coupling member decreases as the angle of the portions of the elongated member 502 on opposite sides of the adjustor 524 decreases from 180 degrees, and the distance between the first coupling member and the second coupling member increases when the angle of the portions of the elongated member 502 on opposite sides of the adjustor 524 increases toward 180 degrees. As also illustrated and discussed above with reference to FIGS. 6A and 6B, the adjuster 624 may pivotally connect and/or provide for the extension of two or more portions of the elongated member 602 to increase or decrease the distance between the first coupling member and the second coupling member as well.

The method 800 then proceeds to block 806 where the rack chassis is moved. In an embodiment, the rack 200 may be transported from a first location to a second location. In a specific example, the anti-tip members on any of the anti-tip devices coupled to the rack 200 may be adjusted as discussed above such that the rack 200 may be rolled on the casters 204 via a surface from the first location to the second location without the anti-tip members engaging the surface when the rack is substantially level. As discussed above, the rack 200 may have a first tip angle while resting on the casters 206 and/or being moved via the casters 206, and that first tip angle of the rack 200 may not meet recommended safety standards when the rack is being moved. While the method 800 at block 804 describes the rack chassis being moved from a first location to a second location, one skilled in the art in possession of the present disclosure will recognize that the moving of the rack may include exerting a force on the rack 200 to cause the rack to move in a desired direction, about an axis, and/or in a variety of other manners known in the art. In different embodiment, the adjustable foot assemblies 206 and optionally the casters 204 may support the weight of rack 200. While being supported by the adjustable foot assemblies 206, the rack 200 has a second tip angle which may be greater than the first tip angle (e.g., when the adjustable foot assemblies 206 have a greater track width than the casters 204.) In some embodiments, the rack 200 may be stationary in that it is not laterally moving from a first location to a second location, and forces on the rack 200 may be provided by an object colliding with the rack 200 or a natural force such as, for example wind or an earthquake, exerting a force on the rack 200 causing the rack 200 to move, tilt, vibrate, and/or cause other movements known in the art.

The method 800 then proceeds to block 808 where at least one anti-tip member of a plurality of anti-tip members that extend from the first anti-tip device and the second anti-tip device engages a surface to prevent the rack chassis from exceeding a rack chassis tip angle. In an embodiment, the anti-tip member of the plurality of anti-tip members that engages the surface is located immediately adjacent a first end of the elongated member and/or immediately adjacent a second end of the elongated member. In another embodiment, the anti-tip member that engages the surface is transversely coupled to the elongated member. As discussed below, the anti-tip members may contact the surface to provide a tip-angle for the rack 200 that is greater than the tip angle of the rack when supported by the casters 204 and/or adjustable foot members 206.

In an embodiment including the anti-tip device 300 of FIGS. 3A and 3B with the anti-tip members 316 that extend transversely from the elongated member 302, the anti-tip members 316 may include wheels 318 that engage the surface when the rack 200 is moved. The engagement of the anti-tip members 316 with the surface provides a tip angle for the rack 200 that exceeds the rack chassis tip angle of the rack 200 when the rack 200 is supported by the casters 204 and/or adjustable foot assemblies 206. Embodiments of the anti-tip members 316 that include the wheels 318 may provide for the increase in the tip angle while also providing increased mobility for the rack 200 in place of or in addition to the casters 204.

In an embodiment including the anti-tip device 400 of FIGS. 4A and 4B with the anti-tip members 416 that extend from the elongated member 402 immediately adjacent the first end 408 and the second end 410, the anti-tip members 416 may be adjustable foot subsystems 418 configured to support the weight of the rack 200 along their radial axis. The anti-tip members 416 may be adjusted to a height above the surface to allow the rack 200 to be moved from the first location to the second location via the casters 204, and the engagement of the foot members 418 with the surface when the rack 200 begins to tip may be configured to provide the increase in the tip angle.

In an embodiment, the method 800 may benefit from modifying the location of the anti-tip members via the adjusters discussed above. As discussed above, the relative location of the anti-tip member and the base support member 202 of the rack 200 may be adjusted to adjust the track width of the rack, thus increasing the tip angle of the rack. For example, a particular rack may have a relatively high center of gravity that results in a relatively low tip angle, and the foot members 620 of the anti-tip device may be adjusted by the adjusters 626 and 628 to adjust the relative locations of the foot members 620 and the base support member 202 (e.g., extending from the corners of the base support member 620) to provide a greater track width to compensate for the relatively high center of gravity. As illustrated in FIGS. 6A and 6B, the second adjuster 626 and/or third adjuster 628 are configured extend or retract the track width of two or more portions of the elongated member 602 to adjust the position of the anti-tip member.

In an embodiment including the anti-tip device 700 of FIGS. 7A and 7B with the adjustable foot subsystem supports 702. For example, the adjustable foot subsystems 206 may include a track width that provides a sufficient tip angle for the rack 200, but the adjustable foot subsystems 206 may not be configured to support a load of the rack 200 along their radial axis (e.g., if a rack begins to tip, the load on the adjustable foot subsystems 206 may cause failure of the adjustable foot subsystems 206 and subsequent tipping of the rack 200.) The adjustable foot subsystem supports 702 may be coupled to the adjustable foot subsystems 206 as discussed above, and may be configured to provide the necessary radial axis support needed by the adjustable foot subsystems 206 to support the load from the rack 200 if the rack 200 begins to tip, thus providing the increased tip angle for the rack 200.

Thus, systems and methods have been described that provide for a rack anti-tip system that increases a rack tip angle of a rack while being configured to engage a wide variety of racks. Such benefits are provided by engaging an elongated member of an anti-tip device to common adjustable foot members that are typically provided on the rack, and utilizing anti-tip members that extend from the elongated member to extend the track width of the rack, thus lowering the height of the center of gravity of the rack and increasing the tip angle of the rack. The rack anti-tip system is particularly useful while a rack is being moved from a first location to a second location, as casters that are conventionally used to move racks typically have a narrow track width that results in low tip angles that do not meet recommended safety standards. As such, the rack anti-tip system of the present disclosure provides relatively inexpensive anti-tip devices having features that couple to a vast majority of existing racks in order to allow the tip angle of those racks to be increased during rack movement (e.g., rack delivery to a customer) to prevent rack tipping and possible damage that would result.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. An anti-tip system, comprising:
    an elongated member that includes:
        a first end;
        a second end located opposite the elongated member from the first end; and
        a plurality of coupling members that are provided on the elongated member between the first end and the second end and that are each configured to directly engage the elongated member to a respective adjustable foot subsystem of a rack having a first tip angle; and
    a plurality of anti-tip members extending from the elongated member, wherein the plurality of anti-tip members are positioned relative to the plurality of coupling members to cause the rack to have a second tip angle that is greater than the first tip angle when the elongated member is coupled to the rack.

2. The anti-tip system of claim 1, wherein the elongated member includes an adjuster that is located between the first end and the second end, wherein the adjuster is configured to adjust the distance of the elongated member between a first coupling member of the plurality of coupling members and a second coupling member of the plurality of coupling members.

3. The anti-tip system of claim 1, wherein the elongated member includes an adjuster between a first coupling member of the plurality of coupling members and a first anti-tip member of the plurality of anti-tip members, wherein the adjuster is configured to adjust the distance between the first coupling member and the first anti-tip member.

4. The anti-tip system of claim 1, wherein a first anti-tip member of the plurality of anti-tip members is located immediately adjacent the first end, and wherein a second anti-tip member of the plurality of anti-tip members is located immediately adjacent the second end.

5. The anti-tip system of claim 1, wherein the plurality of anti-tip members are transversely coupled to the elongated member.

6. The anti-tip system of claim 1, wherein the plurality of anti-tip members include wheels.

7. The anti-tip system of claim 1, wherein the plurality of coupling members are defined by the elongated member and each configured to receive a respective adjustable foot subsystem of the rack, and wherein the elongated member is configured to be mounted to the rack by adjusting each respective adjustable foot subsystem of the rack.

8. The anti-tip system of claim 1, wherein the plurality of coupling members that are provided on the elongated member between the first end and the second end and that are each configured to directly engage the elongated member to the respective adjustable foot subsystem of the rack are configured to couple to at least one of an extender and a foot member of the respective adjustable foot subsystem.

9. An Information Handling System (IHS), comprising
    a rack chassis that includes a support base wall and a first tip angle;
    a plurality of adjustable foot subsystems extending from the support base wall of the rack chassis;
    a first anti-tip device coupled to a first portion of the plurality of adjustable foot subsystems, wherein the first anti-tip device is oriented parallel to a first edge of the support base wall; and
    a second anti-tip device couple to a second portion of the plurality of adjustable foot subsystems, wherein the second anti-tip device is oriented parallel to a second edge of the support base wall such that the second anti-tip device is located opposite of rack chassis from the first anti-tip device, wherein each of the first anti-tip device and the second anti-tip device includes:
    an elongated member that includes:
        a first end;
        a second end located opposite the elongated member from the first end; and
        a plurality of coupling members that are provided on the elongated member between the first end and the second end and that are each configured to directly engage the elongated member to a respective adjustable foot subsystem of the plurality of adjustable foot subsystems; and
    a plurality of anti-tip members extending from the elongated member, wherein the plurality of anti-tip members are positioned relative to the plurality of coupling members to cause the rack chassis to have a second tip angle that is greater than the first tip angle when the elongated member is coupled to the rack chassis.

10. The IHS of claim 9, wherein the elongated member includes an adjuster between the first end and the second end, wherein the adjuster is configured to adjust the distance of the elongated member between a first coupling member of the plurality of coupling members and a second coupling member of the plurality of coupling members.

11. The IHS of claim 9, wherein the elongated member includes an adjuster between a first coupling member of the plurality of coupling members and a first anti-tip member the plurality of the plurality of anti-tip members, wherein the adjuster is configured to adjust the distance between the first coupling member and the first anti-tip member.

12. The IHS of claim 9, wherein a first anti-tip member of the plurality of anti-tip members is located immediately adjacent the first end, and wherein second anti-tip member of the plurality of anti-tip members is located immediately adjacent the second end.

13. The IHS of claim 9, wherein the plurality of anti-tip members are transversely coupled to the elongated member.

14. The IHS of claim 9, wherein the plurality of anti-tip members include wheels.

15. The IHS of claim 9, wherein the plurality of coupling members are defined by the elongated member and each configured to receive a respective adjustable foot subsystem of the rack chassis, and wherein the elongated member is configured to be mounted to the rack chassis by adjusting each respective adjustable foot subsystem of the rack chassis.

16. The IHS of claim 9, wherein the plurality of coupling members that are provided on the elongated member between the first end and the second end and that are each configured to directly engage the elongated member to the respective adjustable foot subsystem are configured to couple to at least one of an extender and a foot member of the respective adjustable foot subsystem.

17. A method of preventing a rack chassis from tipping, comprising:
- directly engaging a plurality of coupling members, which are provided between a first end and a second end of an elongated member of a first anti-tip device, with a first set of adjustable foot subsystems of a rack chassis along a first side of the rack chassis;
- directly engaging a plurality of coupling members, which are provided between a first end and a second end of an elongated member of a second anti-tip device, with a second set of adjustable foot subsystems of the rack chassis along a second side of the rack chassis that is opposite the first side;
- moving the rack chassis;
- engaging a surface with at least one anti-tip member of a plurality of anti-tip members that extend from each of the first anti-tip device and the second anti-tip device to prevent the rack chassis from exceeding a rack chassis tip angle.

18. The method of claim 17, further comprising adjusting, at an adjuster of the elongated member between the first end and the second end, the distance of the elongated member between a first coupling member of the plurality of coupling members and a second coupling member of the plurality of coupling members.

19. The method of claim 17, further comprising adjusting, at an adjuster of the elongated member between a first coupling member of the plurality of coupling members and a first anti-tip member of the plurality of anti-tip members, the distance between the first coupling member and the first anti-tip member.

20. The method of claim 17, wherein a first anti-tip member of the plurality of anti-tip members is located immediately adjacent the first end and a second anti-tip member of the plurality of anti-tip members is located immediately adjacent the second end.

21. The method of claim 17, wherein the plurality of anti-tip members are transversely coupled to the elongated member.

22. The method of claim 17, further comprising:
- receiving, at each of the plurality of coupling members of the first anti-tip device, a respective adjustable foot subsystem of the first set of adjustable foot subsystems; and
- adjusting each respective adjustable foot subsystem to mount the elongated member of the first anti-tip device to the rack chassis.

23. The method of claim 17, wherein the directly engaging the plurality of coupling members, which are provided between the first end and the second end of the elongated member of the first anti-tip device, with the first set of adjustable foot subsystems of the rack chassis along the first side of the rack chassis includes engaging the plurality of coupling members with at least one of an extender and a foot member of each adjustable foot subsystem of the first set of adjustable foot subsystems, and wherein the directly engaging the plurality of coupling members, which are provided between the first end and the second end of the elongated member of the second anti-tip device, with the second set of adjustable foot subsystems of the rack chassis along the second side of the rack chassis that is opposite the first side includes engaging the plurality of coupling members with at least one of an extender and a foot member of each adjustable foot subsystem of the second set of adjustable foot subsystems.

* * * * *